(12) United States Patent
Ishiguro

(10) Patent No.: US 7,795,979 B2
(45) Date of Patent: Sep. 14, 2010

(54) AUTOMATIC GAIN CONTROL CIRCUIT AND LOW NOISE AMPLIFYING CIRCUIT

(75) Inventor: Kazuhisa Ishiguro, Ota (JP)

(73) Assignee: Ricoh Co., Ltd., Tokyo (JP)

( * ) Notice: Subject to any disclaimer, the term of this patent is extended or adjusted under 35 U.S.C. 154(b) by 0 days.

(21) Appl. No.: 12/298,370

(22) PCT Filed: Nov. 29, 2006

(86) PCT No.: PCT/JP2006/324303

§ 371 (c)(1),
(2), (4) Date: Oct. 24, 2008

(87) PCT Pub. No.: WO2007/122771

PCT Pub. Date: Nov. 1, 2007

(65) Prior Publication Data

US 2009/0096527 A1    Apr. 16, 2009

(30) Foreign Application Priority Data

Apr. 24, 2006 (JP) .............................. 2006-118745

(51) Int. Cl.
*H03G 3/10* (2006.01)

(52) U.S. Cl. ...................... 330/284; 330/310

(58) Field of Classification Search ................. 330/277, 330/284, 311

See application file for complete search history.

(56) References Cited

U.S. PATENT DOCUMENTS

| 6,175,279 B1 * | 1/2001 | Ciccarelli et al. ........... 330/296 |
| 6,498,926 B1 * | 12/2002 | Ciccarelli et al. ........ 455/240.1 |
| 7,391,269 B2 * | 6/2008 | Chiba ......................... 330/311 |

FOREIGN PATENT DOCUMENTS

| JP | 09174883 | 7/1997 |
| JP | 10084300 | 3/1998 |
| JP | 10327091 | 12/1998 |
| JP | 2000278109 | 10/2000 |
| JP | 2001007657 | 1/2001 |
| JP | 2002506304 | 2/2002 |
| WO | WO-9945637 | 9/1999 |

* cited by examiner

*Primary Examiner*—Khanh V Nguyen
(74) *Attorney, Agent, or Firm*—Connolly Bove Lodge & Hutz LLP; Arlene P. Neal

(57) ABSTRACT

By connecting an antenna damping circuit (4) and a bypass switch (5) in series and connecting the series circuit and an LNA (3) in parallel, it is possible to inhibit a generation of a signal path for connecting the bypass switch (5) to the LNA (3) in series in an operation of the LNA (3) and to prevent a noise factor of the LNA (3) from being deteriorated due to an on resistance of the bypass switch (5).

7 Claims, 3 Drawing Sheets

Fig. 4

| VD[dBμ] | VUD[dBμ] | Ga[dB] | Gn[dB] |
|---|---|---|---|
| 10 | 45 | 0 | 20 |
| 10 | 50 | 0 | 15 |
| 10 | 55 | 0 | 10 |
| ⋮ | | | |
| 50 | 50 | 0 | 20 |
| 50 | 55 | 0 | 15 |
| 50 | 60 | 0 | 10 |
| 50 | 65 | 0 | 5 |
| 50 | 70 | 0 | 0 |
| ⋮ | | | |
| 90 | 90 | 0 | 20 |
| 90 | 95 | 0 | 15 |
| 90 | 100 | 0 | 10 |
| 90 | 105 | 0 | 5 |
| 90 | 110 | 0 | 0 |
| 90 | 115 | −5 | 0 |
| ⋮ | | | |

US 7,795,979 B2

AUTOMATIC GAIN CONTROL CIRCUIT AND LOW NOISE AMPLIFYING CIRCUIT

FIELD OF THE INVENTION

The present invention relates to an automatic gain control circuit and a low noise amplifying circuit, and more particularly to an automatic gain control circuit including a radio frequency amplifying circuit and an attenuating circuit which have variable gains.

DESCRIPTION OF THE RELATED ART

A wireless communicating apparatus such as a radio receiver is usually provided with an AGC (Automatic Gain Control) circuit for controlling a gain of a received signal. An RF (Radio Frequency) AGC circuit controls a gain of a radio frequency signal (an RF signal) received by an antenna and maintains a level of the received signal to be constant. The RF-AGC can be implemented by controlling a quantity of attenuation in an antenna damping circuit or a gain of an LNA (Low Noise Amplifier) or the like.

The RF-AGC circuit is not operated when an electric field strength of an antenna input signal is not greater than a threshold, and does not reduce the gain of the received signal. However, when a signal having a strong electric field is input to an antenna so that the electric field strength exceeds the threshold, the RF-AGC circuit is operated to reduce the gain of the received signal, thereby preventing an excessive power from being applied to the wireless communicating apparatus.

In a wireless communicating apparatus including a circuit having n stages, generally, when noise factors in the respective stages are represented by $NF_1, NF_2, \ldots NF_n$, and gains in the respective stages are represented by $G_1, G_2, \ldots G_n$, a total noise factor $NF_{all}$ is expressed as follows.

$$NF_{all} = NF_1 + (NF_{2-1})/G_1 + (NF_{3-1})/G_1 G_2 + \ldots (NF_{n-1})/G_1 G_2 \ldots G_{n-1}$$

In the equation, a value to be added is decreased toward a subsequent term. For this reason, the total noise factor $NF_{all}$ is mostly determined by the noise factor $NF_1$ in an initial stage. The tendency becomes more remarkable when the gain $G_1$ in the initial stage is increased.

Consequently, a gain of an LNA positioned in an RF stage is increased so that an influence of a noise factor in a circuit connected to a subsequent stage is reduced. Thus, the noise factor of the LNA is predominant for the total noise factor $NF_{all}$. However, when the gain of the LNA is set to be high, a limit of a dynamic range of the LNA and a level of a received signal input to a circuit in a subsequent stage are increased. Therefore, there is caused a drawback that a distortion characteristic is deteriorated.

In order to eliminate the drawback, there has been proposed a technique for providing a bypass switch of the LNA to carry out switching for using the LNA or performing bypassing corresponding to a level of a received signal (for example, see Patent Documents 1 and 2). In the technique described in the Patent Documents 1 and 2, an attenuator (an antenna damping circuit) and the LNA are connected in parallel and either the antenna damping circuit or the LNA can be selected and used.

Patent Document 1: Japanese Laid-Open Patent Publication No. 9-72955

Patent Document 2: Japanese Laid-Open Patent Publication No. 10-327091

DISCLOSURE OF THE INVENTION

However, in the prior art described in the Patent Documents 1 and 2, a switch is connected in series to a parallel circuit of the attenuator and the LNA. For this reason, there is a problem in that a noise factor of the LNA is deteriorated by an on resistance of the switch and a desirable input sensitivity cannot be obtained in an operation of the LNA.

In order to solve the problem, it is an object of the present invention to eliminate a drawback that a noise factor of an LNA is deteriorated, thereby obtaining a desirable input sensitivity in a circuit structure in which a bypass switch is provided for a radio frequency amplifying circuit.

In order to attain the object, in an automatic gain control circuit according to the present invention, an attenuating circuit and a bypass switch are connected in series and an input/output node of the series circuit and that of a radio frequency amplifying circuit are connected to each other so that the series circuit and the radio frequency amplifying circuit are connected in parallel.

According to the present invention having the structure described above, the bypass switch is connected in parallel with the radio frequency amplifying circuit and is not connected in series thereto. Therefore, it is possible to prevent a noise factor of the radio frequency amplifying circuit from being deteriorated by an on resistance of the bypass switch, thereby obtaining a desirable input sensitivity.

BRIEF DESCRIPTION OF THE DRAWINGS

FIG. 4 is a table showing an example of a gain control in the LNA and the antenna damping circuit according to the present embodiment.

BEST MODE FOR CARRYING OUT THE INVENTION

Figure 1:
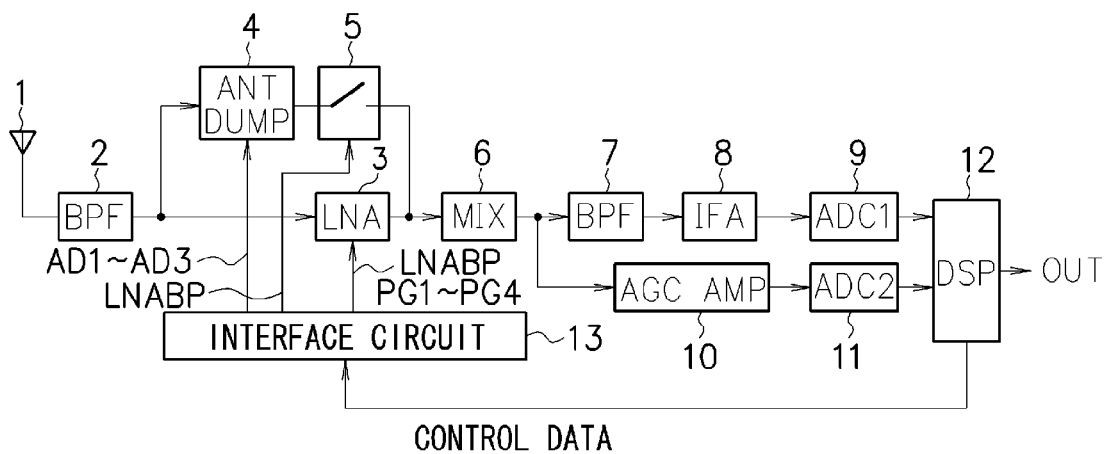
FIG. 1 is a diagram showing an example of a structure of a radio receiver executing an automatic gain control circuit according to the present invention.

An embodiment according to the present invention will be described below with reference to the drawings. FIG. 1 is a diagram showing an example of a structure of a radio receiver executing an automatic gain control circuit according to the present invention. As shown in FIG. 1, the radio receiver according to the present embodiment includes an antenna 1, a band-pass filter (BPF) 2, an LNA 3, an antenna damping circuit 4, a bypass switch 5, a frequency converting circuit 6, a BPF 7, an IF amplifier 8, a first A/D converting circuit 9, an AGC amplifier 10, a second A/D converting circuit 11, a DSP (Digital Signal Processor) 12, and an interface circuit 13. These structures (excluding the antenna 1) are integrated into a single semiconductor chip through a CMOS (Complementary Metal Oxide Semiconductor) process, for example.

The BPF 2 selectively outputs a broadcast wave signal in a specific frequency band from broadcast wave signals received by the antenna 1. The BPF 2 has a comparatively broad pass band and causes a broadcast signal including a desirable band to pass therethrough. The LNA 3 corresponds to a radio frequency amplifying circuit according to the present invention and amplifies a radio frequency signal passing through the BPF 2 with a low noise. A gain of the LNA 3 is controlled in response to control signals PG1 to PG4 supplied from the interface circuit 13. Moreover, the LNA 3 switches ON/OFF of a current path in an amplifying portion in response to a control signal LNABP supplied from the interface circuit 13.

The antenna damping circuit 4 corresponds to an attenuating circuit according to the present invention and controls the radio frequency signal passing through the BPF 2 to have a degree of attenuation which is variably set in response to control signals AD1 to AD3 supplied from the interface circuit 13. The bypass switch 5 is connected in series to the antenna damping circuit 4 and is turned ON/OFF in response to the control signal LNABP supplied from the interface circuit 13.

As shown in FIG. 1, an input node of the LNA 3 is connected to that of a series circuit constituted by the antenna damping circuit 4 and the bypass switch 5, and an output node of the LNA 3 is connected to that of the series circuit so that the LNA 3 and the series circuit are connected in parallel. As will be described below, only the antenna damping circuit 4 is used for a gain control when the bypass switch 5 is ON, and only the LNA 3 is used for the gain control when the bypass switch 5 is OFF.

A signal amplified by the LNA 3 or a signal attenuated by the antenna damping circuit 4 is supplied to the frequency converting circuit 6. The frequency converting circuit 6 mixes the radio frequency signal supplied from the LNA 3 or the radio frequency signal supplied from the antenna damping circuit 4 through the bypass switch 5 with a local oscillating signal supplied from a local oscillating circuit which is not shown, and carries out a frequency conversion to generate and output an intermediate frequency signal. The BPF 7 carries out a band limitation for the intermediate frequency signal supplied from the frequency converting circuit 6, thereby extracting an intermediate frequency signal of a narrow band including only one station of a desirable frequency.

The IF amplifier 8 amplifies the intermediate frequency signal (including only a desirable wave) of the narrow band which is output from the BPF 7. The first A/D converting circuit 9 analog-digital converts the intermediate frequency signal output from the IF amplifier 8. The intermediate frequency signal thus converted into digital data is input to the DSP 12. The DSP 12 demodulates, into a baseband signal, a narrowband digital intermediate frequency signal which is input from the first A/D converting circuit 9 and outputs the baseband signal.

The AGC amplifier 10 amplifies an intermediate frequency signal (including both a desirable wave and a disturbing wave) of a broad band which is output from the frequency converting circuit 6. The second A/D converting circuit 11 analog-digital converts the intermediate frequency signal output from the AGC amplifier 10. The intermediate frequency signal thus converted into the digital data is input to the DSP 12.

The DSP 12 detects a level of the narrowband digital intermediate frequency signal which is input from the first A/D converting circuit 9 and detects a level of the broadband digital intermediate frequency signal which is input from the second A/D converting circuit 11, and generates control data for controlling gains of the LNA 3 and the antenna damping circuit 4 corresponding to the detected levels. Then, the control data are output to the interface circuit 13.

The interface circuit 13 generates the control signals AD1 to AD3 in accordance with the control data supplied from the DSP 12 and supplies them to the antenna damping circuit 4, thereby controlling the gain of the antenna damping circuit 4. Moreover, the interface circuit 13 generates the control signals PG1 to PG4 in accordance with the control data supplied from the DSP 12 and supplies them to the LNA 3, thereby controlling the gain of the LNA 3. Furthermore, the interface circuit 13 generates the control signal LNABP in accordance with the control data supplied from the DSP 12 and supplies the control signal LNABP to the LNA 3 and the bypass switch 5, thereby carrying out a control for turning ON/OFF the LNA 3 and the bypass switch 5.

Figure 2:
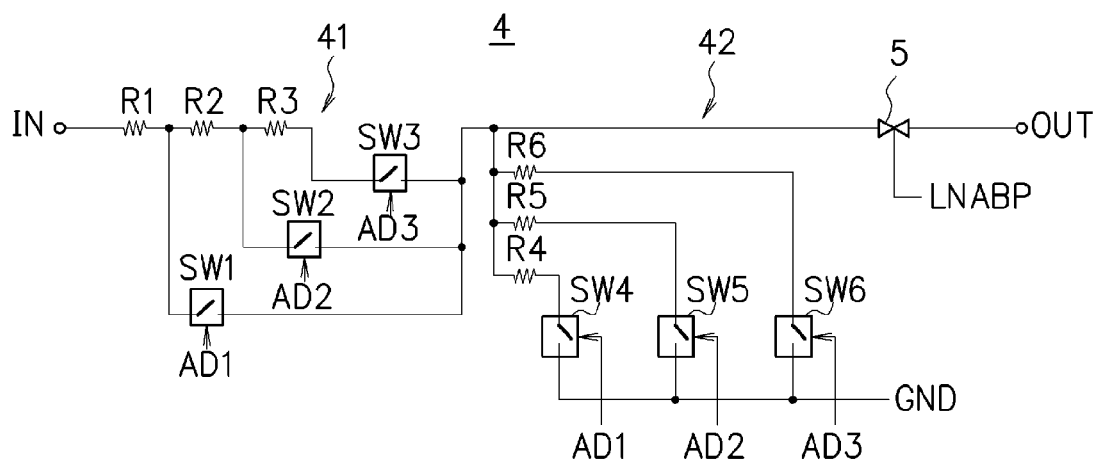
FIG. 2 is a diagram showing an example of a structure of an antenna damping circuit according to the present embodiment.

FIG. 2 is a diagram showing an example of structures of the antenna damping circuit 4 and the bypass switch 5 according to the present embodiment. As shown in FIG. 2, the antenna damping circuit 4 according to the present embodiment is constituted by two sets of variable resistor circuits 41 and 42. The variable resistor circuit 41 is connected in series to the bypass switch 5. Moreover, the variable resistor circuit 42 is connected in parallel with the bypass switch 5 by setting an output stage of the variable resistor circuit 41 as a branch point, and has an end earthed to a ground GND.

The variable resistor circuit 41 includes N resistor elements R1, R2 and R3 (N is an integer of two or more. N is equal to three in the example of FIG. 2) which are connected in series, and N switches SW1, SW2 and SW3 (N is equal to three) for selecting any of the three resistor elements R1, R2 and R3. Resistance values of the three resistor elements R1, R2 and R3 may be equal to each other or different from each other.

The three resistor elements R1, R2 and R3 and the three switches SW1, SW2 and SW3 are ladder connected and any of the switches is turned ON to select the resistor element to be connected in series. For example, when the first switch SW1 is turned ON, only the first resistor element R1 is connected in series to the bypass switch 5. When the second switch SW2 is turned ON, moreover, the first resistor element R1 and the second resistor element R2 are connected in series to the bypass switch 5.

Furthermore, the variable resistor circuit 42 includes N resistor elements R4, R5 and R6 (N is an integer of two or more. N is equal to three in the example of FIG. 2) which are connected in parallel, and N switches SW4, SW5 and SW6 (N is equal to three) for selecting any of the three resistor elements R4, R5 and R6. Resistance values of the three resistor elements R4, R5 and R6 are different from each other.

The three resistor elements R4, R5 and R6 and the three switches SW4, SW5 and SW6 are connected in series respectively, and the three series circuits are connected in parallel with the ground GND. When any of the switches SW4 to SW6 is turned ON, consequently, the resistor element to be connected to the ground GND is selected. For example, when the first switch SW4 is turned ON the first resistor element R4 is earthed to the ground GND. When the second switch SW5 is turned ON, moreover, the second resistor element R5 is earthed to the ground GND.

An operation for turning ON any of the switches SW1 to SW3 constituting the variable resistor circuit 41 is controlled in response to the control signals AD1 to AD3 supplied from the interface circuit 13. Moreover, an operation for turning ON any of the switches SW4 to SW6 constituting the variable resistor circuit 42 is also controlled in response to the control signals AD1 to AD3 supplied from the interface circuit 13. More specifically, the first switches (SW1, SW4), the second switches (SW2, SW5) and the third switches (SW3, SW6) are turned ON or OFF synchronously with each other.

In the antenna damping circuit 4 thus constituted, it is possible to vary a quantity of attenuation by turning ON any of the three sets of switches (SW1, SW4), (SW2, SW5) and (SW3, SW6). For example, the following attenuation quantity ATT is obtained when the switches (SW1, SW4) are ON.

$$ATT=R4/(R1+R4)$$

Figure 3:
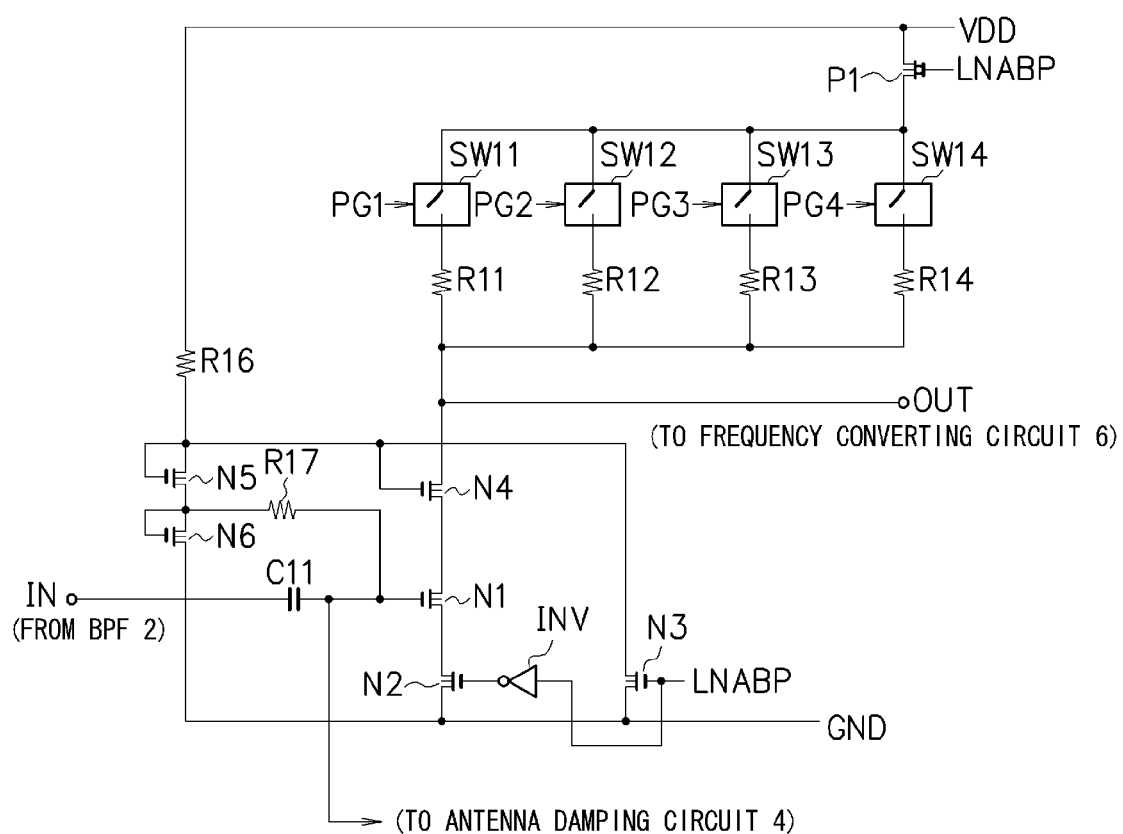
FIG. 3 is a diagram showing an example of a structure of an LNA according to the present embodiment.

FIG. 3 is a diagram showing an example of a structure of the LNA 3 according to the present embodiment. As shown in FIG. 3, the LNA 3 according to the present embodiment includes a variable resistor circuit 31 in order to cause a gain to be variable. The variable resistor circuit 31 includes M resistor elements R11, R12, R13 and R14 (M is an integer of two or more. M is equal to four in the example of FIG. 3) which are connected in parallel and M switches SW11, SW12, SW13 and SW14 (M is equal to four) for selecting any of the four resistor elements R11 to R14. Resistance values of the four resistor elements R11 to R14 are different from each other.

The four resistor elements R11 to R14 and the four switches SW11 to SW14 are connected in series respectively, and the respective series circuits are connected in parallel. When one of the switches is turned ON, consequently, any of the resistor elements which is used as a load resistor is selected. For example, when the first switch SW11 is turned ON, the first resistor element R11 is connected as a load resistor between a power supply VDD and a ground GND. When the second switch SW12 is turned ON, moreover, the second resistor element R12 is connected as the load resistor between the power supply VDD and a fourth nMOS transistor N4.

A pMOS transistor P1 is connected between the variable resistor circuit 31 and the power supply VDD. A first nMOS transistor N1, a second nMOS transistor N2 and the fourth nMOS transistor N4 are connected between the variable resistor circuit 31 and the ground GND. The first nMOS transistor N1 is operated as a source grounding amplifier. The fourth nMOS transistor N4 is cascode connected to the source grounding amplifier N1 and has a drain connected to an output terminal OUT to the frequency converting circuit 6. Moreover, the second nMOS transistor N2 is connected in series to the source grounding amplifier N1 and has a source connected to the ground GND.

The pMOS transistor P1 and the second nMOS transistor N2 serve to control whether the LNA 3 is bypassed or not. In order to control whether the LNA 3 is bypassed or not, moreover, a third nMOS transistor N3 and an inverter INV are further provided. The third nMOS transistor N3 has a drain connected to a gate of the fourth nMOS transistor N4 and a source connected to the ground GND.

The control signal LNABP output from the interface circuit 13 in FIG. 1 is applied to a gate of the pMOS transistor P1 and that of the third nMOS transistor N3, and furthermore, a gate of the second nMOS transistor N2 through the inverter INV.

When the LNA 3 is to be turned ON, the control signal LNABP is set to have a Low level. Consequently, the second nMOS transistor N2 is turned ON, the third nMOS transistor N3 is turned OFF and the pMOS transistor P1 is turned ON so that a source of the source grounding amplifier N1 is earthed to the ground GND and a signal input from the BPF 2 is amplified by the source grounding amplifier N1. The signal thus amplified is output to the frequency converting circuit 6 through the fourth nMOS transistor N4 which is cascode connected to the source grounding amplifier N1.

On the other hand, when the antenna damping circuit 4 is to be turned ON, the control signal LNABP is set to have a High level. Consequently, the second nMOS transistor N2 is turned OFF, the third nMOS transistor N3 is turned. ON and the pMOS transistor P1 is turned OFF so that the signal input from the BPF 2 is output to the frequency converting circuit 6 through the antenna damping circuit 4 and the bypass switch 5.

At this time, the second nMOS transistor N2 is OFF and the third nMOS transistor N3 is ON. Therefore, the source of the source grounding amplifier N1 is brought into a floating state so that the source grounding amplifier N1 is galvanically turned OFF. By galvanically turning OFF the source grounding amplifier N1, it is possible to prevent an input dynamic range in the operation of the antenna damping circuit 4 from being influenced by a non-linear distortion of the source grounding amplifier N1. Thus, it is possible to implement a desirable characteristic.

More specifically, the second nMOS transistor N2 is to be turned OFF because a bias is applied between the gate and the source of the source grounding amplifier N1 and the source grounding amplifier N1 is thus operated like a diode. The non-linear distortion of the diode deteriorates the input dynamic range. By turning OFF the second nMOS transistor N2, it is possible to avoid the drawback. When the third nMOS transistor N3 is turned ON, moreover, the fourth nMOS transistor N4 is turned OFF so that a drain of the source grounding amplifier N1 has no path through which a direct current flows. Consequently, it is possible to enlarge the input dynamic range in the operation of the antenna damping circuit 4.

By turning OFF the pMOS transistor P1 in the operation of the antenna damping circuit 4, furthermore, it is possible to prevent an unnecessary direct current from flowing through the variable resistor circuit 31.

In the case in which the LNA 3 is constituted as described above, the gain of the LNA 3 is caused to be variable by switching the connection of the resistor elements R11 to R14. For example, when the first switch SW11 is turned ON in response to the control signal PG1, a gain VG is expressed as follows.

VG gm($R11+R_{on}+R_{pon}$)

$R_{on}$: on resistance of switch SW11 gm: mutual conductance of source grounding amplifier N1

$R_{pon}$: on resistance of pMOS transistor P1

Description will be given to an example of the operations of the LNA 3, the antenna damping circuit 4 and the bypass switch 5. FIG. 4 is a table showing an example of the gain control of the LNA 3 and the antenna damping circuit 4. In FIG. 4, VD indicates a detected level of a narrowband digital intermediate frequency signal (a desirable wave), VUD indicates a detected level of a broadband digital intermediate frequency signal (a desirable wave and a disturbing wave), Ga indicates a gain of the antenna damping circuit 4, and Gn indicates a gain of the LNA 3.

As shown in FIG. 4, the gain Gn of the LNA 3 and the gain Ga of the antenna damping circuit 4 are controlled based on the level VD of the narrowband digital intermediate frequency signal and the level VUD of the broadband digital intermediate frequency signal. Consequently, an electric field strength of a received signal is prevented from exceeding a dynamic range of a circuit, thereby improving an occurrence of a distortion. In this case, the gain Ga of the antenna damping circuit 4 is reduced (the gain is attenuated to be equal to or smaller than zero [dB]) if the gain Gn of the LNA 3 is first reduced (an amplification gain is caused to approximate to zero [dB]) to attenuate the received signal, and then, the quantity of the attenuation is still insufficient.

For example, if an AGC range is set to be 60 [dB], the gain Gn is reduced by a maximum of 20 [dB] through the LNA 3 corresponding to the level of the broadband digital intermediate frequency signal when the level VD of the narrowband digital intermediate frequency signal is smaller than a predetermined value D. When the level VD of the narrowband digital intermediate frequency signal is greater than the predetermined value D and the level of the broadband digital intermediate frequency signal is also greater than a predetermined value UD, the quantity of the attenuation becomes insufficient even through a reduction in the gain Gn of the LNA 3 by 20 [dB]. In this case, the antenna damping circuit 4 carries out the attenuation corresponding to a maximum of 40 [dB] depending on the level of the broadband digital intermediate frequency signal. When the gain Gn of the LNA 3 is to be controlled, the bypass switch 5 is turned OFF. On the other hand, when the gain Ga of the antenna damping circuit 4 is to be controlled, the LNA 3 is brought into an electrical OFF state to turn ON the bypass switch 5.

As described above, in the automatic gain control circuit according to the present embodiment, the antenna damping circuit 4 is connected in parallel with the LNA 3 and is connected in series to the bypass switch 5. By the structure, a resistance attenuator such as the antenna damping circuit 4 is not provided on a signal path in the operation of the LNA 3. Therefore, the noise factor of the LNA 3 is not influenced. In addition, the bypass switch 5 is not connected in series to the LNA 3. Therefore, it is also possible to prevent the noise factor of the LNA 3 from being deteriorated by the on resistance of the bypass switch 5.

On the other hand, the signal path in the operation of the antenna damping circuit 4 is provided in order of the BPF 2, the antenna damping circuit 4, the bypass switch 5 and the frequency converting circuit 6 and does not pass through the LNA 3. In general, the LNA 3 is designed with a high gain in order to obtain a desirable input sensitivity. For this reason, it is hard to increase the dynamic range. On the other hand, the bypass switch 5 is constituted by an analog switch or the like. Therefore, it is possible to increase the dynamic range. By bringing the bypass switch 5 into an ON state, consequently, it is possible to obtain a signal path passing through the bypass switch 5 having a wide dynamic range with a gain of approximately zero. Thus, it is also possible to considerably improve an intermodulation distortion characteristic obtained when two disturbing waves are input.

As described above in detail, according to the present embodiment, the gains of the LNA 3 and the antenna damping circuit 4 are properly set corresponding to the levels of the desirable wave and the disturbing wave, and the bypass switch 5 is appropriately turned ON/OFF. Moreover, the bypass switch 5 is connected in parallel with the LNA 3 and is not connected in series to the LNA 3. Therefore, it is possible to prevent the noise factor of the LNA 3 from being deteriorated by the on resistance of the bypass switch 5. Consequently, it is possible to optimize a noise characteristic and a distortion characteristic, thereby obtaining a desirable input sensitivity.

Although the description has been given to the example in which the narrowband digital intermediate frequency signal is A/D converted and the signal thus A/D converted is input to the DSP 12, and the broadband digital intermediate frequency signal is A/D converted and the signal thus A/D converted is input to the DSP 12 to generate control data for RF-AGC through the DSP 12 in the embodiment, the present invention is not restricted thereto. For example, it is also possible to generate a control voltage for the RF-AGC by an analog circuit in place of the A/D converting circuits 9 and 11 and the DSP 12.

While the description has been given to the example in which the gains of the LNA 3 and the antenna damping circuit 4 are controlled in the embodiment, moreover, the present invention is not restricted thereto. For example, it is also possible to further control the gain of the frequency converting circuit 6 by outputting a control voltage from the interface circuit 13 to the frequency converting circuit 6.

While the source grounding amplifier is used for the LNA 3 in the embodiment, furthermore, a gate grounding amplifier may be used. For example, the LNA 3 can be constituted in the following manner.

An automatic gain control circuit including:

a first nMOS transistor to be operated as a gate grounding amplifier for amplifying an input signal; and second and third nMOS transistors for carrying out a control to turn ON/OFF a current path of the first nMOS transistor, wherein the second nMOS transistor is connected in series to the first nMOS transistor and a source of the second nMOS transistor is grounded, a drain of the third nMOS transistor is connected to a gate of the first nMOS transistor and a source of the third nMOS transistor is grounded, and a predetermined control signal is applied to a gate of the third nMOS transistor and a signal obtained by inverting a logic of the predetermined control signal is applied to a gate of the second nMOS transistor.

In addition, the embodiment is only illustrative for carrying out the present invention and the technical range of the present invention should not be construed to be restrictive. In other words, the present invention can be carried out in various forms without departing from the spirit or main features thereof.

INDUSTRIAL APPLICABILITY

The present invention is useful for an automatic gain control circuit including a radio frequency amplifying circuit and an attenuating circuit which have variable gains. The automatic gain control circuit can be applied to a wireless communicating apparatus such as a radio receiver, a television receiver or a portable telephone.

What is claimed is:

1. An automatic gain control circuit comprising:
a radio frequency amplifying circuit for amplifying a received radio frequency signal with a variably set gain;
an attenuating circuit for controlling the received radio frequency signal to have a variably set attenuation degree; and
a bypass switch connected in series to the attenuating circuit,
wherein an input/output node of a series circuit constituted by the attenuating circuit and the bypass switch and that of the radio frequency amplifying circuit are connected to each other to connect the series circuit and the radio frequency amplifying circuit in parallel,
wherein the radio frequency amplifying circuit includes:
a first nMOS transistor to be operated as a source grounding amplifier for amplifying an input signal;
second and third nMOS transistors for carrying out a control to turn ON/OFF a current path of the first nMOS transistor; and
a fourth nMOS transistor which is cascode connected to the first nMOS transistor,
wherein the second nMOS transistor is connected in series to the first nMOS transistor and a source of the second nMOS transistor is grounded, a drain of the third nMOS transistor is connected to a gate of the fourth nMOST transistor and a source of the third nMOS transistor is grounded, and a predetermined control signal is applied to a gate of the third nMOS transistor and a signal obtained by inverting a logic of the predetermined control signal is applied to a gate of the second nMOS transistor.

2. The automatic gain control circuit according to claim 1, wherein the radio frequency amplifying circuit includes:

a MOS transistor to be operated as an amplifier for amplifying an input signal; and a MOS transistor for carrying out a control to turn ON/OFF a current path of the amplifier.

3. The automatic gain control circuit according to claim 1, wherein a pMOS transistor is connected in series to the first nMOS transistor through a load resistor and a source of the pMOS transistor is connected to a power supply, and the predetermined control signal is applied to a gate of the pMOS transistor.

4. The automatic gain control circuit according to claim 1, wherein the predetermined control signal serves to carry out a control for turning ON/OFF the bypass switch.

5. The automatic gain control circuit according to claim 3, wherein the predetermined control signal serves to carry out a control for turning ON/OFF the bypass switch.

6. A low noise amplifying circuit comprising:

a first nMOS transistor to be operated as a source grounding amplifier for amplifying an input signal;

second and third nMOS transistors for carrying out a control to turn ON/OFF a current path of the first nMOS transistor; and a fourth nMOS transistor which is cascode connected to the first nMOS transistor, wherein the second nMOS transistor is connected in series to the first nMOS transistor and a source of the second nMOS transistor is grounded, a drain of the third nMOS transistor is connected to a gate of the fourth nMOS transistor and a source of the third nMOS transistor is grounded, and a predetermined control signal is applied to a gate of the third nMOS transistor and a signal obtained by inverting a logic of the predetermined control signal is applied to a gate of the second nMOS transistor.

7. The low noise amplifying circuit according to claim 6, wherein a pMOS transistor is connected in series to the first nMOS transistor through a load resistor and a source of the pMOS transistor is connected to a power supply, and the predetermined control signal is applied to a gate of the pMOS transistor.

\* \* \* \* \*